United States Patent
Dojo et al.

(10) Patent No.: US 6,528,357 B2
(45) Date of Patent: Mar. 4, 2003

(54) METHOD OF MANUFACTURING ARRAY SUBSTRATE

(75) Inventors: Masayuki Dojo, Tokyo (JP); Akira Kubo, Tokyo (JP)

(73) Assignee: Kabushiki Kaisha Toshiba, Kanagawa-ken (JP)

( * ) Notice: Subject to any disclaimer, the term of this patent is extended or adjusted under 35 U.S.C. 154(b) by 0 days.

(21) Appl. No.: 09/266,804

(22) Filed: Mar. 12, 1999

(65) Prior Publication Data

US 2002/0132385 A1 Sep. 19, 2002

(30) Foreign Application Priority Data

Mar. 13, 1998 (JP) .......................... 10-063251
Mar. 13, 1998 (JP) .......................... 10-063252
Mar. 13, 1998 (JP) .......................... 10-063253

(51) Int. Cl.$^7$ .............................................. H01L 21/00
(52) U.S. Cl. ...................................... 438/151; 438/155
(58) Field of Search ........................... 438/149, 30, 159, 438/233, 155, 152, 151, 158, 160; 257/59, 32, 72; 349/106, 139, 187, 171, 138, 157

(56) References Cited

U.S. PATENT DOCUMENTS

| | | | | |
|---|---|---|---|---|
| 4,610,859 A | * | 9/1986 | Miyagawa et al. | 423/347 |
| 5,594,259 A | * | 1/1997 | Shimada et al. | 257/66 |
| 5,723,366 A | * | 3/1998 | Suzuki et al. | 438/712 |
| 5,760,854 A | * | 6/1998 | Ono et al. | 349/38 |
| 5,835,177 A | * | 11/1998 | Dohjo et al. | 349/147 |
| 6,036,876 A | * | 3/2000 | Chen et al. | 216/67 |
| 6,122,025 A | * | 9/2000 | Kim | 349/110 |
| 6,175,395 B1 | * | 1/2001 | Yamazaki et al. | 349/44 |
| 6,194,037 B1 | * | 2/2001 | Terasaki et al. | 427/569 |

FOREIGN PATENT DOCUMENTS

| | | | | |
|---|---|---|---|---|
| JP | 04048631 A | * | 2/1992 | H01L/21/308 |
| JP | 05343365 A | * | 12/1993 | H01L/21/302 |
| JP | 07110496 A | * | 4/1995 | G02F/1/136 |
| JP | 07245403 A | * | 9/1995 | H01L/29/786 |

* cited by examiner

Primary Examiner—Wael Fahmy
Assistant Examiner—Brook Kebede
(74) Attorney, Agent, or Firm—Pillsbury Winthrop LLP

(57) ABSTRACT

In the manufacturing method of array substrates for use in flat panel display devices including liquid crystal display (LCD) devices, it is aimed to prevent failure of interlayer dielectric film due to wiring deformation or the like while reducing the resistivity of wiring. It is also aimed to prevent corrosion of a metal wiring layer at the etching process and to thereby prevent deterioration of production yield due to corrosion. According to the method of the invention, to form scanning lines (111), an aluminum-neodymium alloy (Al-Nd) film (1110) is deposited in 300 nm thickness on the first hand, and then 50 nm thick Mo film (1110) is deposited thereon. Subsequently, gate insulator films (115 and 117) are formed by CVD processes at a substrate temperature of 350° C. Further, an etching process for forming pixel electrode (131) is carried out by HBr, HI, Oxalic acid or a mixture liquid containing at least one of these acids.

13 Claims, 12 Drawing Sheets

METHOD OF MANUFACTURING ARRAY SUBSTRATE

BACKGROUND OF THE INVENTION

1. Field of the Invention

The present invention relates to the manufacturing method of array substrates for use in flat panel display devices including liquid crystal display (LCD) devices.

2. Description of the Related Art

In the recent years flat panel display devices are more frequently developed to replace conventional cathode-ray tube (CRT) units; in particular, LCD devices are becoming commercially attractive more and more due to their advantage such as light weight, thinness, low power consumption and the like.

As one typical prior known LCD devices, a light transmissive active-matrix LCD device will now be described herein which comes with a plurality of switch elements each of which is at a respective one of picture elements. The active-matrix LCD device includes a liquid crystal layer held between an array substrate and a counter substrate with orientation films being provided between the liquid crystal layer and any one of such substrates. The array substrate has, on a transparent insulative substrate made of glass, quartz or the like, a plurality of signal lines and a scanning lines arranged in a matrix form. At each of such crosspoints, a thin film transistor (abbreviated to "TFT" hereinafter) made of semiconductor thin film such as amorphous silicon (referred to as "a-Si:H") is connected to the lines. The TFT has a gate electrode electrically connected to a corresponding one of the scanning lines, a drain electrode electrically connected to a corresponding signal line, and a source electrode electrically connected to a transparent conductive material constituting an associated pixel electrode, which material may be indium-tin-oxide (ITO).

The counter substrate is constituted from a glass substrate on which an counter electrode made of ITO is disposed; where displaying of color images is required, a color filter layer will be additionally provided thereon.

With respect to the above-described active-matrix LCD device, construction of the array substrate will be further described by an example having TFTs equipped with channel protective films.

The scanning lines are formed of aluminum (Al) and anodic-oxidized coating layer, which coating layer is formed by anodic oxidation processing on surface layer of the Al in electrolytic solution. Storage capacitor lines are formed in the same manner.

Manufacturing method of these lines is as follows: firstly, an Al layer is deposited on a glass substrate by sputtering technique and then subjected to a patterning treatment to form a prescribed Al wiring pattern; then, certain region of the wiring pattern is selectively covered with anodic-oxidation-proof masking material such as resist, to leave certain Al pattern in the region intact; subsequently, by applying a prescribed voltage onto the Al pattern, an Al oxide layer is formed on the Al wiring pattern to prescribed thickness, for example to 200–300 nm. In this way, the scanning lines, gate electrodes and storage capacitor lines are formed. Subsequently, active portion of the TFT, the pixel electrode, the signal lines, and the source and drain electrodes are formed in a step-by-step manner, to complete the array substrate of the active-matrix LCD device.

However, because anodic-oxidized films have to cover the surface of the aluminum wiring that is a low-resistivity wiring, the manufacturing method requires an anodic oxidation processing including a mask-forming process, and requires extra wiring patterns for voltage supply for the anodic oxidation processes. Thus, a restriction arises in designing of gate wiring patterns, which are wiring patterns for scanning lines and gate electrodes. This restriction leads to lower productivity and lower freedom in designing.

In otherwise, there come to arise an idea of adopting wiring patterns solely made of aluminum. However, in this wiring pattern, deformation such as a hillock may occur. That is a phenomenon where portion of the wiring protrudes in thickness-wise direction. Forming of the hillock on the wiring leads to deterioration of interlayer dielectric property of dielectric films, remarkably decreasing production yield of the array substrate.

Moreover, there has been a problem in that, at an etching process for forming pixel electrodes, its etchant penetrates into the Al wiring layer to corrode the Al, so as to lower the production yield.

SUMMARY OF THE INVENTION

The invention aims to secure low-resistivity of the wiring and yet effectively prevent interlayer short-circuit caused by the deformation of the wiring. The invention also aims to prevent corrosion of the wiring metal layer during the etching process, and thereby prevent decrease of production yield.

The invention according to claim 1 provides a method of manufacturing an array substrate for a display device having a scanning line and gate electrode on a substrate; a thin film transistor having a gate insulator film on said scanning line and gate electrode, a semiconductor film thereon, source and drain electrodes electrically connected to said semiconductor film; a signal line as taken out of the drain electrode to extend substantially perpendicularly to said scanning line; and a pixel electrode electrically connected to the source electrode, comprising steps of: forming said scanning line and gate electrode by patterning a multi-layer metal film having an aluminum alloy layer and a refractory metal layer; and depositing said gate insulator film in direct contact with said scanning line and gate electrode at a temperature not less than 300° C.

The above construction of the scanning line is exemplified as follows. As an Al alloy, an aluminum-neodymium alloy (Al—Nd) of 2 atomic % neodymium is deposited in 300 nm thickness. Then, a refractory metal is deposited on the Al alloy. Thus formed multi-layer film is subjected to a taper-shape-forming processing to form scanning lines. Subsequently, a gate insulator film is formed by plasma CVD techniques at substrate temperature of 350° C.

Due to this multi-layer formation by an Al alloy layer and a refractory metal layer, no deformation of the Al layer and no failure of the dielectric film take place without causing decrease in the production yield of the array substrates. Thus, a wiring resistivity same or lower than that of prior art can be accomplished without causing decrease in the production yield.

At a process step for forming said pixel electrode, even when an etching process is carried out by hydrobromic acid (HBr•aq), hydroiodic acid (HI•aq), oxalic acid ((COOH)$_2$) or a mixture liquid containing at least one of these acid, or even when a dry-etching process is carried out, the Al alloy undergoes no damage from such etching agents because the refractory metal and the gate insulator film are disposed between the etching agents and the scanning line comprised of Al alloy.

BEST MODE EMBODYING THE INVENTION

A description will now be given of a liquid crystal display (LCD) device 1 in accordance with an embodiment of the present invention with reference to FIGS. 1 through 13.

Figure 2:
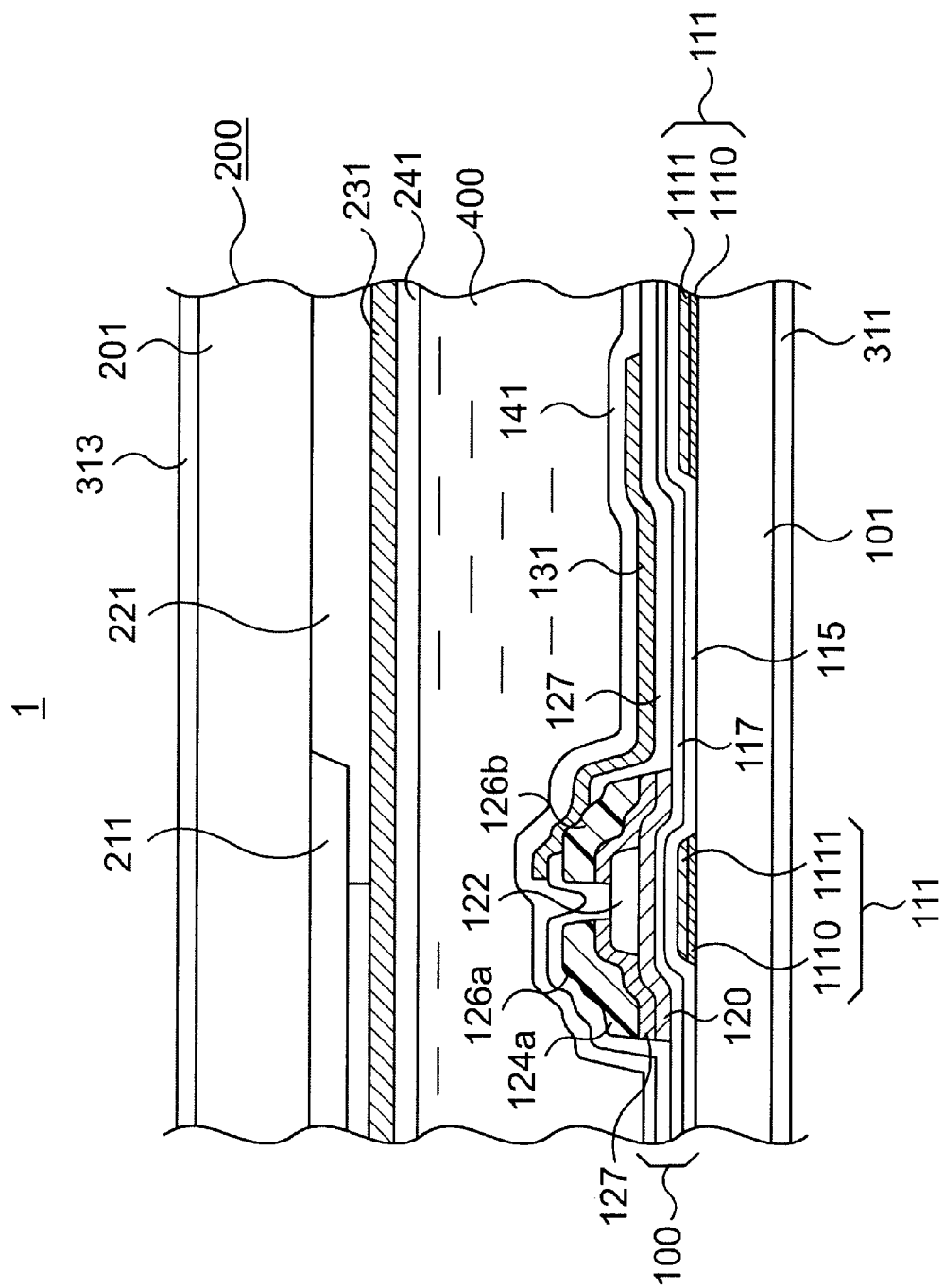
FIG. 2 is a schematic cross-section of the liquid crystal display device taken along line A—A' in FIG. 1.

This LCD device 1 is of the light transmissive type capable of displaying color images. As shown in FIG. 2, LCD device 1 has an array substrate 100, an counter substrate 200, and a twisted nematic (TN) liquid crystal held therebetween through orientation films 141, 241 being laid between it and substrates 100,200. These orientation films 141, 241 are made of polyimide resin. Also, polarization plates 311, 313 are adhered to the outer surfaces of array substrate 100 and counter substrate 200, respectively.

Figure 1:
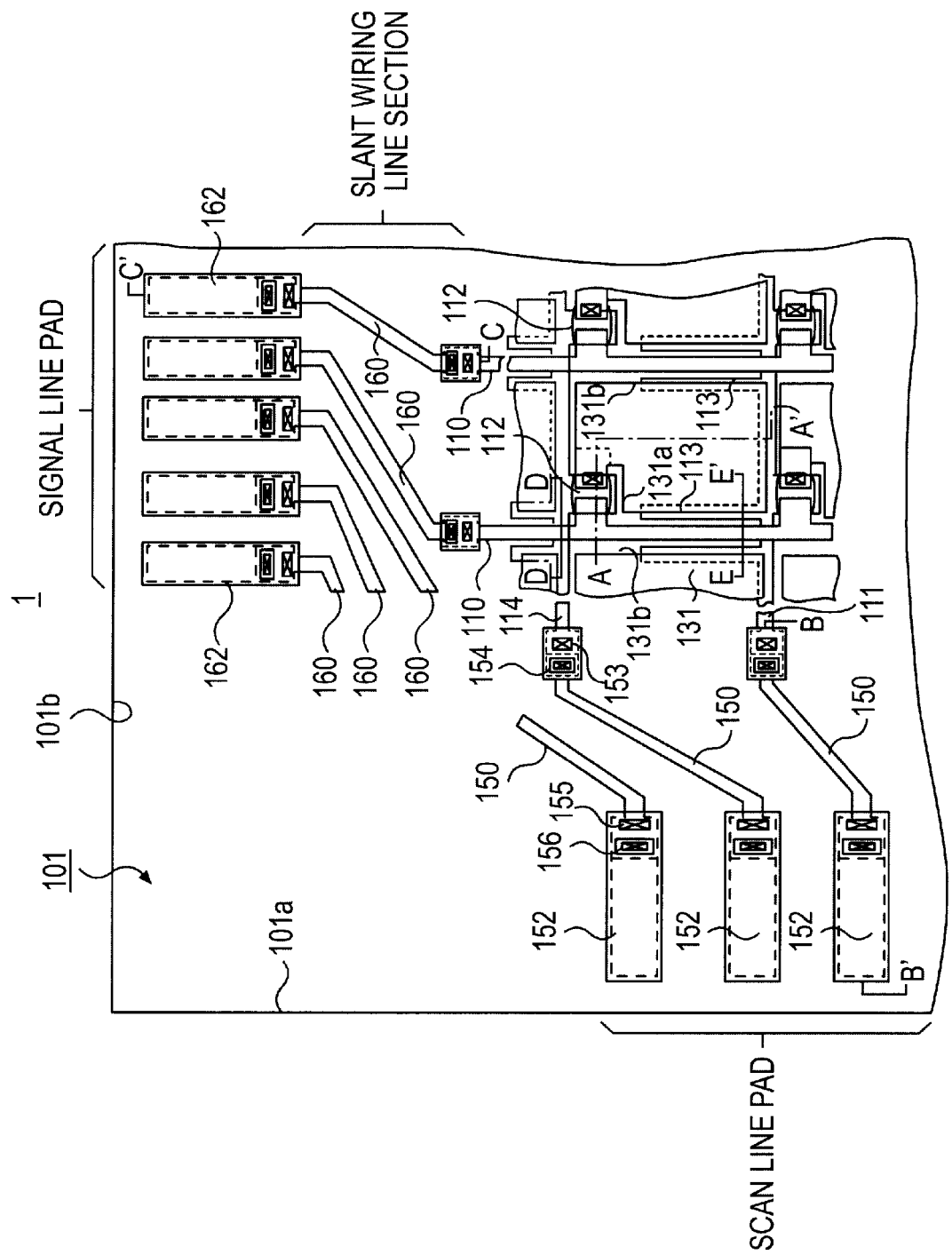
FIG. 1 is a diagram schematically showing a plan view of part of an array substrate in accordance with one preferred embodiment of the present invention.

FIG. 1 shows a schematical plan view of the array substrate 100, wherein the lower side of this drawing is to be located at the upper side of the display screen of LCD device 1 while allowing scanning lines to be successively selected in the sequence from the lower to the upper side of the illustration.

The array substrate 100 includes 480 scanning lines 111 as disposed on a glass substrate 101. One end of each scanning line 111 is taken out to extend toward one edge 101a of the glass substrate 101, and is electrically connected through a slant wiring line section 150 to a corresponding one of scanning line connection pads 152.

The scanning lines 111 have a double-layer structure, consisting of Aluminum-Neodymium (Al—Nd) alloy film 1110, Nd content of which is 2 atomic %, and molybdenum (Mo) film 1111. The term atomic % stands for a molar % in which number of atoms is taken as elementary entity; that is a percentage calculated as follows—number of atoms (molar number) of additive element is divided by number of atoms (molar number) in whole of the alloy, and then multiplied by 100.

The array substrate 100 also includes 1,920 signal lines 110, which lines extend to intersect the scanning lines 111 at substantially right angles on the glass substrate 101. Each signal line 110 is taken out to run toward the other edge 101b of the glass substrate 101, and is electrically connected via a slant wiring line section 160 to a corresponding signal line connection pad 162.

The signal lines 110 has a three-layer structure, consisting of a first layer made of Mo, a second layer made of Al, and a third layer made of Mo.

A TFT 112 is disposed near each of the cross-points of the scanning lines 111 and signal lines 110. Also, a pixel electrode 131 which is made of ITO and coupled to TFT 112 is disposed over the scanning line 111 and signal line 110 with an interlayer dielectric film 127 being provided therebetween. This interlayer dielectric film 127 may be an inorganic dielectric film made of silicon nitride, silicon oxide or the like, or an organic resin coated film of acryl-based material; preferably, the interlayer dielectric film is constituted from a multi-layer film of a combination of such inorganic dielectric film and organic resin coated film thereby further improving the surface flatness and interlayer dielectricity.

(Structure of TFT Region)

An explanation will be given of the structure of TFT 112.

Figure 6:
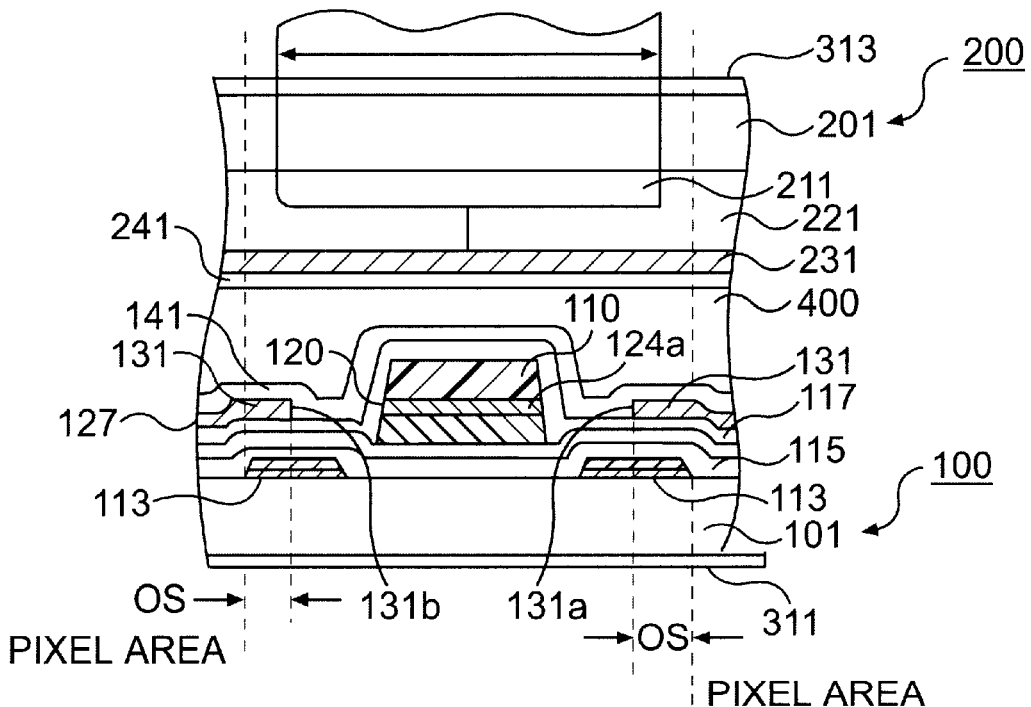
FIG. 6 is a schematic cross-section of the liquid crystal display device taken along line E—E' in FIG. 1.
Figure 7:
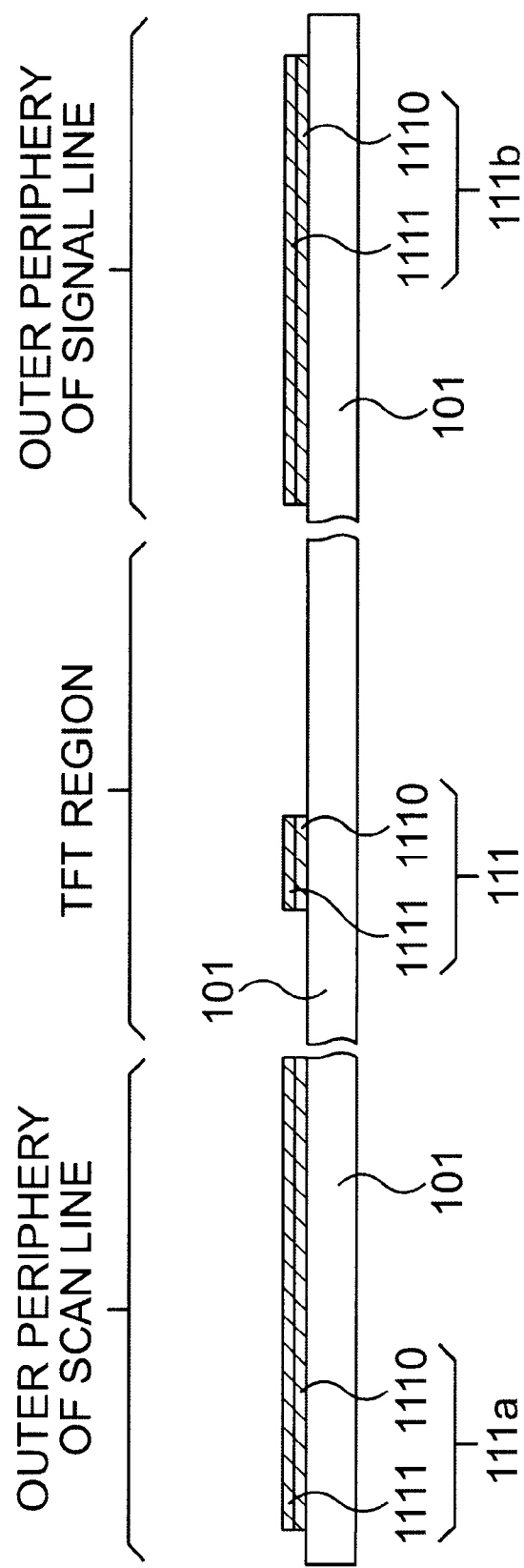
FIG. 7 is a diagram for explanation of a first step in the manufacture of the array substrate shown in FIG. 1.

Each scanning line 111 includes a fine strip-shaped elongate region 113 extending along the signal line 110 to overlap the edges 131a, 131b of one neighboring pixel electrode 131. As shown in FIG. 6, the pixel electrode 131 and the elongate region 113 from a next scanning line 111 with respect to the scanning line 111 for the pixel electrode 131 overlap each other at certain overlap region (OS), with a first gate insulator film 115, a second gate insulator film 117 and interlayer dielectric film 127 being laid therebetween, causing such overlap region (OS) to constitute a storage capacitance (Cs). Further, with this embodiment, the pixel electrode 131 overlaps the prestage scanning line 111 per se through the first gate insulator film 115, second gate insulator film 117 and interlayer dielectric film 127 to form a further overlap region which also constitutes the storage capacitor (Cs).

The counter substrate 200 opposing this array substrate 100 is disposed on a glass substrate 201, and includes a matrix-shaped light shielding film 211 made of a chosen resin material which shields light rays towards the TFT 121 region and from the gap spacing between the pixel electrode 131 and any one of signal lines 110 and scanning lines 111. A color filter 221 having three color components of red (R), green (G) and blue (B) is disposed in a certain region corresponding to the pixel electrode 131. Provided on this is another counter electrode 231 made of a transparent conductive material.

With the array substrate 100 of this LCD device 1 thus arranged, since the interlayer dielectric film 127 alone or both the first and second gate insulator films 115, 117 and interlayer dielectric film 127 are disposed between the pixel electrode 131 and any one of signal lines 110 and scanning lines 111, it is possible for pixel electrode 131 to be disposed sufficiently close to or over respective wiring lines 110, 111, thereby enabling achievement of increased aperture ratio.

Another advantage of the illustrative embodiment is that since the storage capacitor (Cs) is formed between the pixel electrode 131 and the elongate region 113 extended from one scanning line 111 neighboring to such pixel electrode 131, it is no longer necessary to employ any extra storage capacitor wiring lines enabling achievement of further increased aperture ratio. Especially, in this embodiment, because TFT 112 is constituted using as its gate electrode a specific region taken out of the signal line 110 to extend along the signal line 110, it becomes possible for pixel electrode 131 to overlap the prestage scanning line 111 per se. This may advantageously serve to attain sufficient storage capacitor (Cs) while enabling achievement of high aperture ratio.

Also, since three kinds of insulator or dielectric films 115, 117, 127 are laminated and disposed between the pixel electrode 131 and the scanning line 111 and between the pixel electrode 131 and elongate region 113, it is possible to successfully suppress occurrence of electrical interlayer shorting due to the inherent structure of the embodiment.

Incidentally, in this embodiment, the pixel area is defined in planar size not by the light-shield film 211 disposed on the counter electrode 200, but by the scanning line 111 and its elongate region 113 on the array substrate 100. Accordingly, the alignment accuracy of the product is dependent solely upon an alignment accuracy of a first mask pattern for use in patterning scanning lines 111 to a fifth mask pattern for patterning pixel electrodes 131, rather than depending on an alignment accuracy of the array substrate 100 to counter substrate 200. This may avoid the need to add extra margins to the width of light shield film 211 in view of possible alignment variations of the array substrate 100 to counter substrate 200, thus enabling accomplishment of further increased aperture ratio.

Yet another advantage of the embodiment is that even when the elongate region 113 of scanning line 111 is fully extended along the edges 131a, 131b of pixel electrode 131 along the signal line 110 in order to define the boundary of pixel area, it is possible to suppress or eliminate an excessive increase in storage capacitor (Cs) without degrading the productivity. This can be said because the interlayer dielectric film 127 is disposed—in addition to the first gate insulator film 115 and second gate insulator film 117— between the pixel electrode 131 and the elongate region 113 of scanning line 111.

Figure 5:
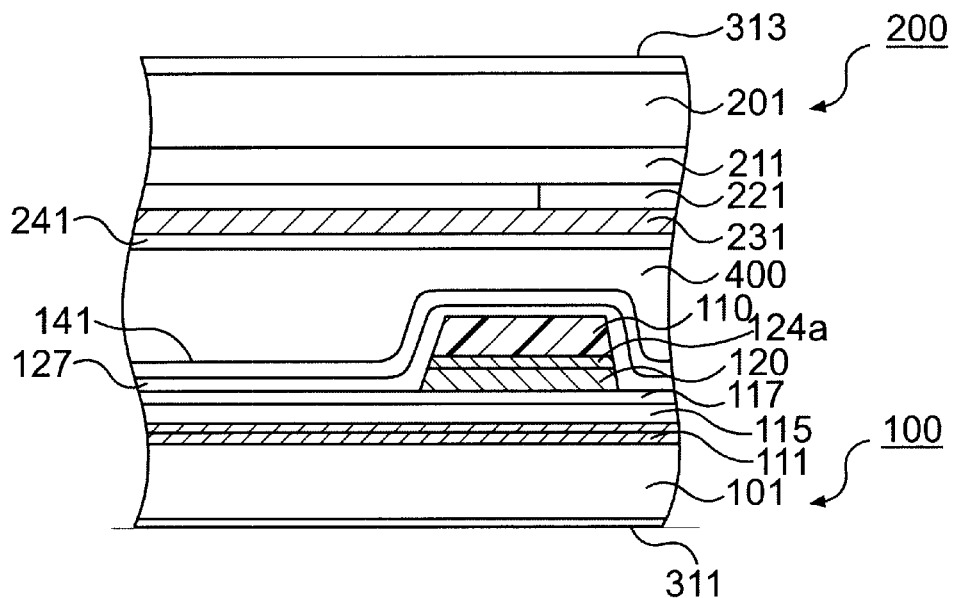
FIG. 5 is a schematic cross-section of the liquid crystal display device taken along line D—D' in FIG. 1.

A further advantage of the embodiment is that, as shown in FIG. 5, the signal line 110 is exactly identical in outline to a low-resistance semiconductor film 124a and semiconductor film 120. More specifically, not only the first and second gate insulator films 115,117 but also the low-resistance semiconductor film 124a and semiconductor film 120 are laminated at the individual one of crosspoints of signal lines 110 and scanning lines 111. Due to this, even on occasions where mask deviations take place during patterning process steps, the capacitance can remains unchanged between the signal lines 110 and scanning lines 111, thereby suppressing variations or fluctuations in scanning-line capacitance or in signal-line capacitance among devices manufactured. Moreover, this may suppress or eliminate interlayer shorting otherwise occurring due to static electricity at crosspoints of signal lines 110 and scanning lines 111, contaminants during process steps, or presence of pinholes in respective insulator films 115,117, thus enabling provision of higher yield of production.

A still further advantage is that since the signal line 110 coincides in outline with low-resistance semiconductor film 124a as shown in FIG. 6, unlike the prior art causing patterning to be done at separate process steps, it is possible to sufficiently suppress occurrence of capacitive variations between the signal lines 110 and scanning lines 111 even if mask alignment deviations take place during respective patterning steps.

A yet further advantage is that when the signal line 110 is designed to overlap the elongate region 113 of scanning line 111, that is, even when in the structure of FIG. 6 the elongate region 113 being disposed neighboring through the signal line 110 is connected under the signal line 110, since the semiconductor film 120 in addition to respective insulator films 115,117 is disposed between the signal line 110 and the elongate region 113 of scanning line 111, any interlayer shorting can be prevented from occurring due to static electricity, contaminants during processes or pinholes within respective insulator films 115,117, attaining high manufacturing yield. And, with such an arrangement causing the elongate region 113 to be disposed under the pixel electrode 131 neighboring to signal line 110, the capacitive coupling between signal line 110 and pixel electrode 131 can be shielded by elongate region 113 lightening adverse interference of the potential at pixel electrode 131 with potential changes of signal line 110. Yet, the semiconductor film 120 as disposed between signal line 110 and insulator films 115,117 and low-resistance semiconductor film 124a are identical in outline with signal line 110. For these reasons, it is permissible that signal line 110 and pixel electrode 131 are located closely to each other attaining further increased aperture ratio.

(Structure near Outer Periphery of Scanning Line)

Figure 3:
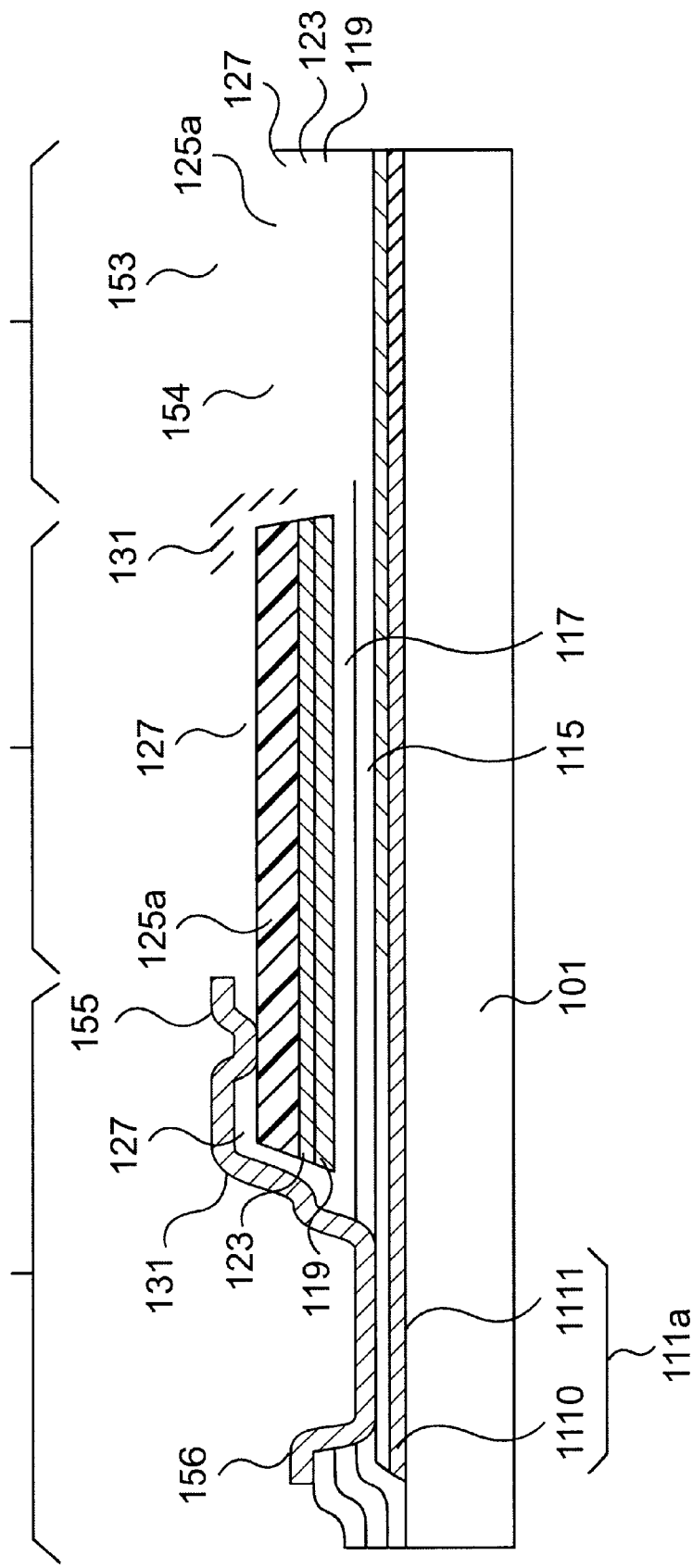
FIG. 3 is a schematic cross-section of the liquid crystal display device taken along line B—B' in FIG. 1.

A reference is made to FIGS. 1 and 3 for explanation of the structure near the outer peripheral section of scanning line 111.

The scanning line 111 is taken out on the side of one edge 101a of the glass substrate 101, constituting a lower-layer wiring line section 111a that is guided toward a slant wiring line section 150 and a scanning-line connection pad 152.

In the slant wiring line section 150 two laminated insulator films 115,117 are disposed on the lower-layer wiring line section 111a as extended from the scanning line 111. Also provided on these two insulator films 115,117 are a semiconductor coated film 119, a low-resistance semiconductor coated film 123 and an upper-layer wiring line section 125a consisting of a Mo—W alloy film being same as signal line 110 in material and in process, which are laminated sequentially. An interlayer dielectric film 127 is formed on the upper-layer wiring line section 125a.

And, in the base section of this slant wiring line section 150, a first contact hole 153 and a second contact hole 154 making a pair are disposed closely to each other in the wiring-line direction, whereby the lower-layer wiring line section 111a which is extended from the scanning line 111 and the upper-layer wiring line section 125a are electrically connected to each other by the signal line connection layer 131, which is the same in material (ITO, here) and process as pixel electrode 131, through the first contact hole 155 and second contact hole 156. Note that the second contact hole 154 is an opening penetrating the two-layered insulator films 115,117, semiconductor coated film 119, low-resistance semiconductor coated film 123 and upper-layer wiring line section 125a causing the principal surface of the lower-layer wiring line section 111a to be partly exposed, whereas the first contact hole 153 is an opening penetrating the interlayer dielectric film 127 exposing part of the principal surface of upper-layer wiring line section 125a.

In the scanning line pad 152 also, a pair of first contact hole 155 and second contact hole 156 are disposed closely to each other in the wiring-line direction, whereby the lower-layer wiring line section 111a of scanning line 111 and the upper-layer wiring line section 125a are electrically connected by the signal line connection layer 131—this is the same in material (ITO, here) and process as pixel electrode 131—to each other through the first contact hole 155 and second contact hole 156. Note that the second contact hole 156 is an opening penetrating the double-layered insulator films 115,117, semiconductor coated film 119, low-resistance semiconductor coated film 123 and upper-layer wiring line section 125a causing the principal surface of the lower-layer wiring line section 111a to be partly exposed in the same manner as in the second contact hole 154 as mentioned above; the first contact hole 155 is similar to the aforesaid first contact hole 153 in that it is an opening penetrating the interlayer dielectric film 127 exposing part of the principal surface of upper-layer wiring line section 125a.

With such an arrangement, the resulting slant wiring line section 150 of scanning line 111 is constituted from the upper-layer wiring line section 125a as comprised of a Mo—W alloy film that is fabricated using the same material and same process as the signal line 110 subjected to patterning separately, and the lower-layer wiring line section 111a as extended from the scanning line 111 made of Al—Y alloy film; by these two layers, the base section of slant wiring line section 150 and scanning line pad 152 are electrically connected together.

Due to such structure, in the slant wiring line section 150, even if it is happen that any one of upper-layer wiring line section 125a and lower-layer wiring line section 111a is broken or open-circuited accidentally, the other of them still remains connected successfully suppressing or eliminating failure of electrical interconnection at slant wiring line section 150.

Further, sufficient reduction in resistance can be accomplished because of the fact that the slant wiring line section 150 includes the lower-layer wiring line section 111a formed of Al—Y alloy that is one low-resistance material employing Al as its major component.

It should be noted that in this embodiment, the region of second contact hole 156, that is, the laminated region of lower-layer wiring line section 111a and signal line connection layer 131 mainly functions as an interconnection region of the scanning line pad 152.

(Structure near Outer Periphery of Signal Line)

Figure 4:
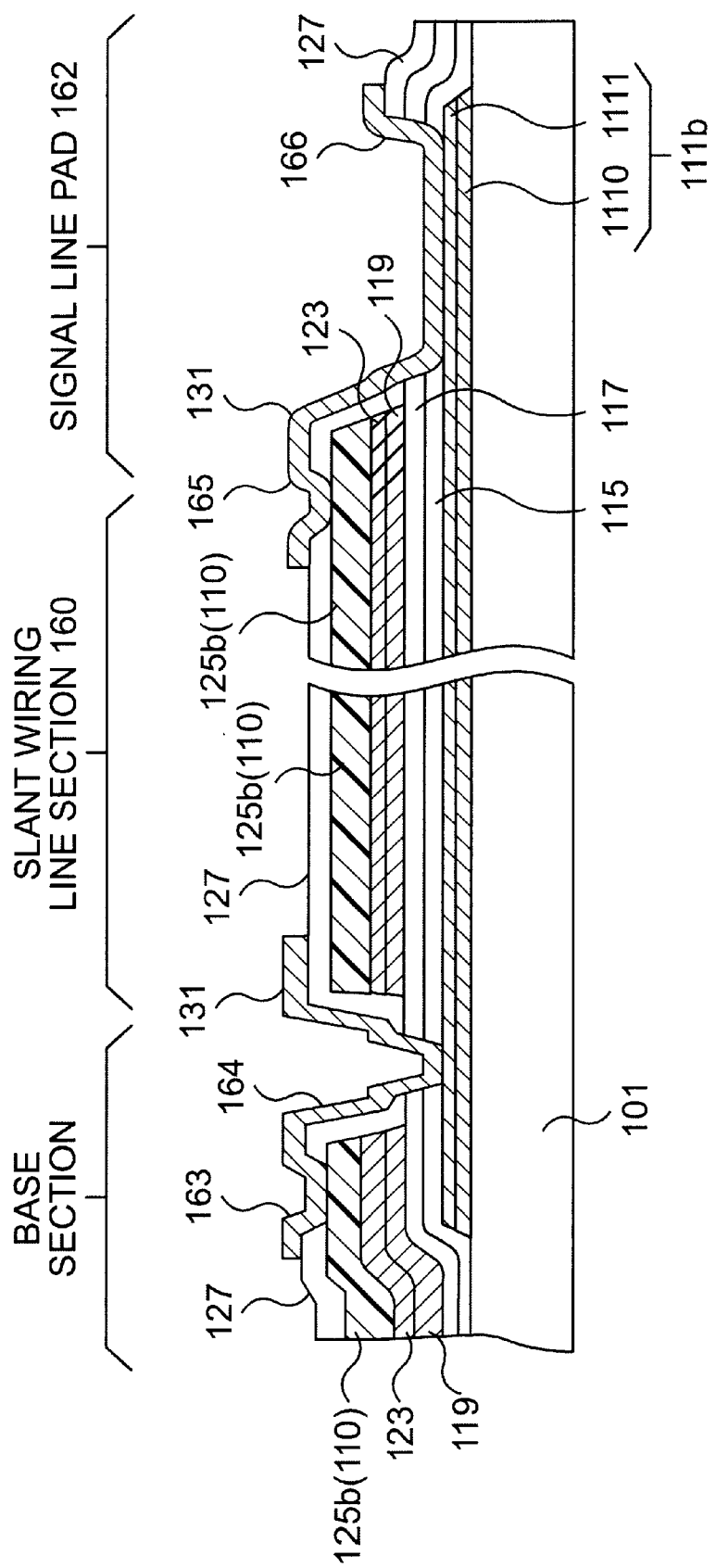
FIG. 4 is a schematic cross-section of the liquid crystal display device taken along line C—C' in FIG. 1.

A reference is made to FIGS. 1 and 4 for explanation of the structure near the outer peripheral section of signal lines 110.

A lower-layer wiring line section 111b, which is the same in material and in process as scanning lines 111, is disposed at the slant wiring line section 160 of signal line 110 and the signal line pad 162 on the side of one edge 101b of glass substrate 101 in a one-to-one correspondence manner with each signal line 110.

In the slant wiring line section 160 two layers of insulator films 115,117 are disposed on the lower-layer wiring line section 111b. Provided on such two-layered insulator films 115,117 are semiconductor coated film 119, low-resistance semiconductor coated film 123 and upper-layer wiring line section 125b as extended from signal line 110 while causing the interlayer dielectric film 127 to be disposed on the upper-layer wiring line section 125b.

And, in the base section of this slant wiring line section 160, a first contact hole 163 and a second contact hole 164 forming a pair are disposed closely to each other in the wiring-line direction, whereby the upper-layer wiring line section 125b which is extended from the scanning line 111 and the lower-layer wiring line section 111b are electrically connected to each other by signal line connection layer 131 same in material—ITO, here—and process as pixel electrode 131. Note that the second contact hole 164 is an opening penetrating the double-layered insulator films 115, 117, semiconductor coated film 119, low-resistance semiconductor coated film 123 and upper-layer wiring line section 125b causing the principal surface of the lower-layer wiring line section 111b to be partly exposed, whereas the first contact hole 163 is an opening penetrating the interlayer dielectric film 127 exposing part of the principal surface of upper-layer wiring line section 125b.

In the signal line pad 162 also, a pair of first contact hole 165 and second contact hole 166 are disposed closely to each other along the wiring-line direction, whereby the upper-layer wiring line section 125b extended from signal line 110 and the lower-layer wiring line section 111b are electrically connected to each other by the signal line connection layer 131, which is the same in material (ITO, here) and process as pixel electrode 131. Note that the second contact hole 166 is an opening penetrating the double-layered insulator films 115,117, semiconductor coated film 119, low-resistance semiconductor coated film 123 and upper-layer wiring line section 125b causing the principal surface of the lower-layer wiring line section 111b to be partly exposed in the same manner as in the second contact hole 164 as discussed previously; the first contact hole 165 is similar to the aforesaid first contact hole 163 in that it is an opening penetrating the interlayer dielectric film 127 exposing part of the principal surface of upper-layer wiring line section 125b.

With such a structure, in the slant wiring line section 160, the upper-layer wiring line section 125b as extended from the signal line 110 and the lower-layer wiring line section 111b comprised of the same material as scanning lines 111 and fabricated in the same process as scanning lines 111 are disposed in lamination; by these two layers, the base section of slant wiring line section 160 and the signal line pad 162 are electrically coupled together.

Due to this, in the slant wiring line section 160, even on occasions where any one of upper-layer wiring line section 125b and the lower-layer wiring line section 111b is broken to be open-circuited, the other thereof still remains connected suppressing or eliminating failure of electrical interconnection at slant wiring line section 160.

Furthermore, sufficient reduction in resistance can also be accomplished since the slant wiring line section 160 includes the lower-layer wiring line section 111b formed of Al—Nd alloy that is a low-resistance material.

It should be noted that in this embodiment, the region of second contact hole 166, that is, the laminated region of lower-layer wiring line section 111b and signal line connection layer 131 acts as the major interconnection region of the signal line pad 162.

With the arrangement as described above, where external connection nodes—including a bump of driver IC, terminals of flexible printed circuit (FPC) board, tape carrier package (TCP) or the like—are to be electrically connected to the signal line pads 162 and scanning line pads 152 by way of an interconnection layer(s) such as anisotropic conductive films (ACFs), even when the signal line pads 162 and scanning line pads 152 are equal in connection conditions, it becomes possible to substantially equalize heat and pressure or the like as applied to such interconnection layers due to the fact that the signal line pads 162 and scanning line pads 152 are substantially the same in arrangement, enabling manufacture under the same condition. Specifically, with this embodiment, the connection region of each scanning line pad 152 is mainly constituted from the lamination structure of the lower-layer wiring line section 111a as taken out of a corresponding scanning line 111 and the signal line connection layer 131 made of ITO that is the same as the material constituting pixel electrodes 131; on the other hand, the connection region of each signal line connection pad 162 is mainly constituted from the lower-layer wiring line section 111b as formed simultaneously with fabrication of scanning lines 111, and the signal line connection layer 131 made of ITO that is the same as the material constituting pixel electrodes 131, wherein the structure is substantially the same.

(Manufacturing Process of Array Substrate)

A method of forming or manufacturing the array substrate 100 will be described in detail with reference to FIGS. 7 through 13.

(1) First Process Step

An Al—Nd alloy film and an Mo film are sequentially deposited by sputtering techniques on the glass substrate 101 to a thickness of 300 nanometers (nm) and to 30 nm, respectively.

Thickness of the Mo film in the range of 50–500 nm, preferably 50–300 nm, is proper. When the thickness is less than the 50 nm, the hillock on the Al film is not sufficiently suppressed. Meanwhile, when the thickness exceeds the 500 nm, a problem of at-step-portion discontinuation of the insulator film arises.

As for an Al alloy film, even in the case where an aluminum-yttrium film (Al—Y film, 2 atomic % of Y) is adopted for example, things goes on almost the same manner with the case where the Al—Nd alloy film is adopted. An aluminum-gadolinium film (Al—Gd film, 2 atomic % of Gd), an aluminum-scandium film (Al—Sc film, 2 atomic % of Sc) or the like may also be used.

The Al alloy film undergoes heat-treatment effects by film-forming process of plasma CVD techniques or the like. And, only impurity ingredients segregated to the vicinity of inter-crystal-grains surface, so as to obstruct moving of Al atoms. The impurity ingredients also exists in polycrystalline structure, so as to increase the resistivity by about 30%.

Content of the above additive elements in the Al alloy ranges preferably from 0.5 to 10 atomic %, more preferably from 1 to 3 atomic %. When the content of the additive elements is below 0.5 atomic %, the effect of preventing hillocks by raising apparent melting point or softening temperature is not sufficient in many cases. Meanwhile, when the content of the additive elements exceeds 10 atomic %, it is undesirable because resistivity and production cost are increased.

The Al alloy film may be an alloy film that contains at least two additive elements selected from among Sc, Y, Nd, samarium (Sm), and Gd. In this case, it is preferable to set sum of the contents of additive elements in the range of 0.5–10 atomic %. For a specific example, we can cite a film of Al—Nd—Y alloy containing 1 atomic % of Nd and 1 atomic % of Y, or the like.

As for a refractory metal to be deposited on the Al alloy film to form a multi-layer film, any one metal selected from a group consisting of molybdenum (Mo), tungsten (W), titanium (Ti), tantalum (Ta), chromium (Cr), zirconium (Zr) and hafnium (Hf), vanadium (V) and niobium (Nb) may be used. In otherwise, any one alloy comprised of two or more metals selected from this group may be used. Among these refractory metals, molybdenum (Mo), tungsten (W), titanium (Ti), tantalum (Ta) are preferable.

On the multi-layer film, a pattern of scanning-lines and a part of storage capacitor lines are formed by use of photolithography techniques. Then, an etching process is carried out in a taper-shape forming manner, using an acid mixture consisting of phosphoric acid, acetic acid or nitric acid, to complete scanning lines and storage capacitor lines pattern.

This results in formation of 480 scanning lines 111 on the glass substrate 101 while permitting simultaneous fabrication of lower-layer wiring line sections 111a, each of which constitutes the slant wiring line section 150 of scanning line 111 and scanning line pad 152 on its one edge 101a side, and lower-layer wiring line sections 111b each constituting slant wiring line section 160 of signal line 110 and signal line pad 162 on the side of another edge 101b of the glass substrate.

Further, in the TFT region, a gate electrode is formed which is integral with a corresponding scanning line 111 and is taken out to extend in a specific direction at right angles to scanning lines 111. At the patterning process step elongate regions 113 are also fabricated simultaneously each of which is taken out to extend in the perpendicular direction to scanning lines 111 for formation of the storage capacitor (Cs) required (see FIG. 1).

(2) Second Process Step

Figure 8:
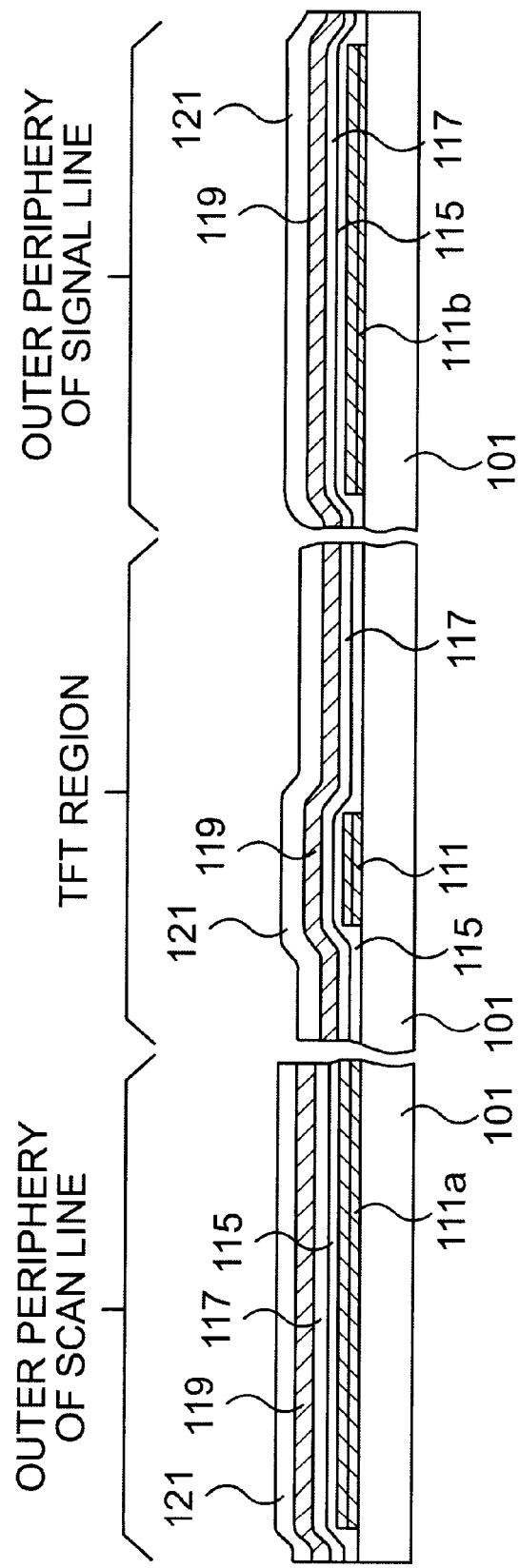
FIG. 8 is a diagram for explanation of a second step in the manufacture of the array substrate shown in FIG. 1.

After completion of the first step, as shown in FIG. 8, a first gate insulator film 115 made of silicon oxide ($SiO_x$) is deposited using atmospheric-pressure plasma chemical vapor deposition (CVD) techniques to a thickness of 150 nm while heating the glass substrate 101 to a temperature not less than 300° C., preferably not less than 330° C. Thereafter, using low-pressure CVD techniques at a substrate temperature in the same range with the above, a second gate insulator film 117 made of silicon nitride ($SiN_x$) 150 nm thick, a 50 nm thick semiconductor coated film 119 made of a-Si:H, and 200 nm thick silicon-nitride channel protective coated film 121 are formed sequentially in this order without exposing them to atmosphere.

By heating the glass substrate 101 at a temperature not less than 300° C. during the film-forming process, it is easy to obtain an insulator film having dielectric strength of $5 \times 10^6$ V/cm.

For each of the first gate insulator film 115 and the second gate insulator film 117 which are mentioned above, a silicone nitride film may be adopted. By adopting a silicone nitride film, in addition to the aforementioned dielectric strength, it become easy to obtain an optical band gap value not less than 5 eV.

In otherwise, the $SiO_x$ film, which constitutes the above-mentioned first gate insulator film 115, may be replaced by an $SiO_2$ film that is formed in use of a thermal CVD technique by heating the glass substrate 101 to a temperature not less than 300° C., preferably not less than 465° C. Even in this case, the hillock is almost suppressed due to synergy effect of Al alloy and Mo, although the heat treatment should give rise a concern of the hillock formation on Al film.

(3) Third Process Step

Figure 9:
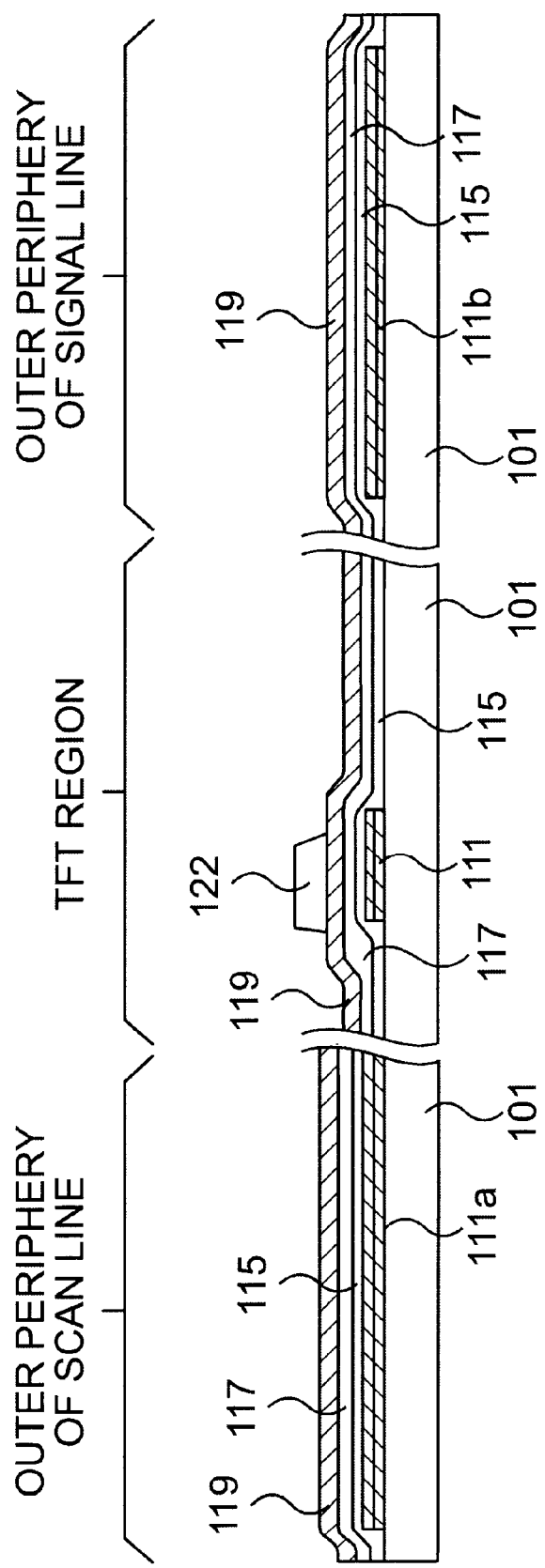
FIG. 9 is a diagram for explanation of a third step in the manufacture of the array substrate shown in FIG. 1.

After the second step, as shown in FIG. 9, the channel protective coated film 121 is subject using rear-surface exposure techniques to patterning process with the scanning lines 111 being as a mask while the coated film 121 is self-aligned with scanning lines 111, and is then subject to exposure process using a second mask pattern to ensure that it corresponds to each TFT region. Thereafter, development and patterning (second patterning) are performed to fabricate an island-like channel protective film 122.

(4) Fourth Process Step

Figure 10:
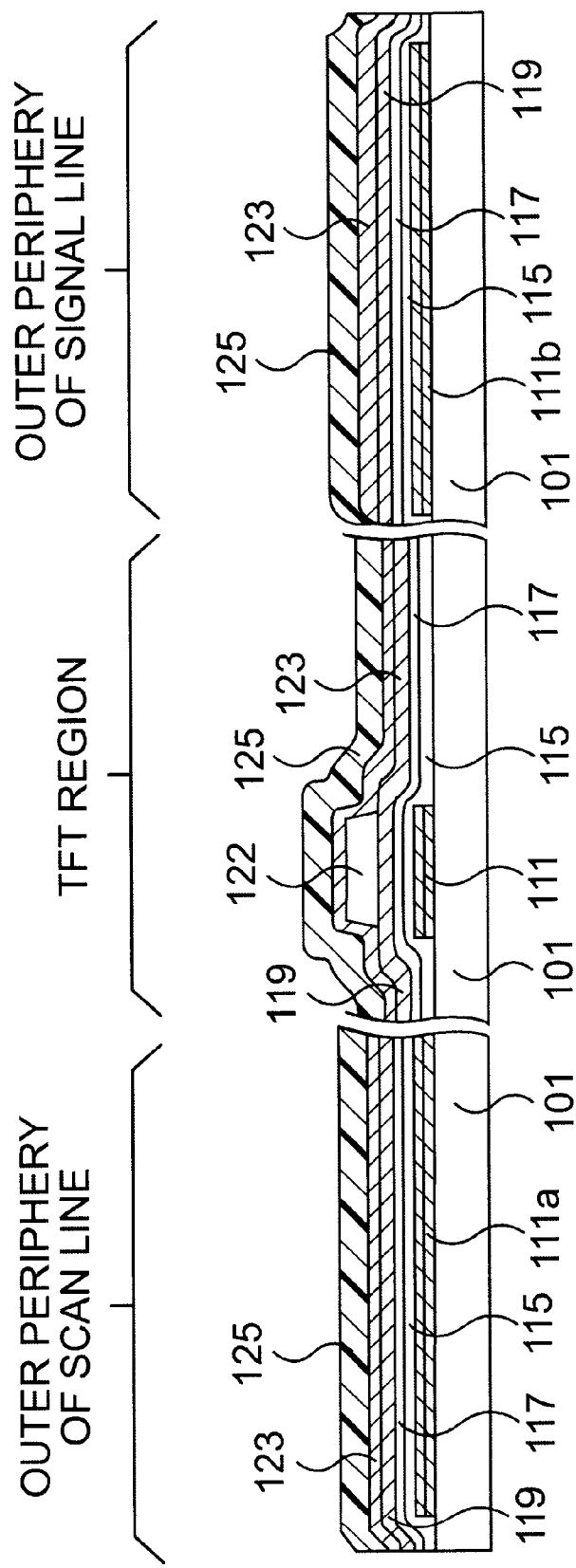
FIG. 10 is a diagram for explanation of a fourth step in the manufacture of the array substrate shown in FIG. 1.

After completion of the third step, as shown in FIG. 10, surface treatment using hydrogen fluoride (HF) solution is applied to the surface of a semiconductor coated film 119 as exposed to obtain good ohmic contacts. Then, a low-resistance semiconductor coated film 123 which is made of $n^+$ type-doped amorphous silicon ($n^+$a-Si:H) containing therein phosphorus (P) impurity is deposited by low-pressure plasma CVD techniques to a thickness of 30 nm.

Next, using sputtering techniques, there is deposited a three-layer film 125 of 300 nm thick having a three-layer structure, consisting of the first layer in which Mo is predominant, the second layer in which Al is predominant, and the third layer in which Mo is predominant.

(5) Fifth Process Step

Figure 11:
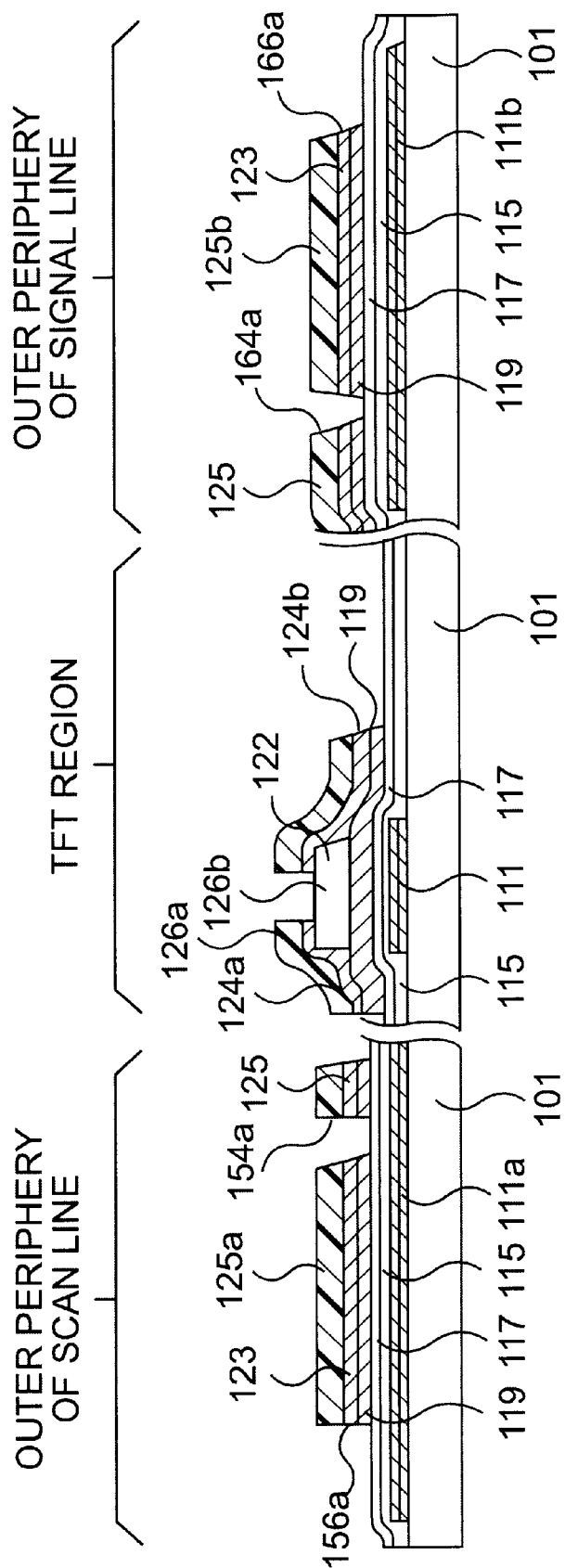
FIG. 11 is a diagram for explanation of a fifth step in the manufacture of the array substrate shown in FIG. 1.

After completion of the fourth step, as shown in FIG. 11, the resulting structure is subject to exposure and development process using a third mask pattern so that all of the three-layer film 125, low-resistance semiconductor coated film 123 and semiconductor coated film 119 are patterned by plasma etching techniques at a time by controlling the selective etching rate of the first gate insulator film 115 or second gate insulator film 117 and the channel protective film 122. This is the third patterning process.

With such a process, in the TFT region, the low-resistance semiconductor film 124a and source electrode 126b are formed integrally, whereas low-resistance semiconductor film 124b and its associated signal line 110 are formed integrally.

In the base section of the scanning line pad 152 and its associative slant wiring line section 150, the three-layer film 125 is patterned along the lower-layer wiring line section 111a forming the upper-layer wiring line section 125a, while the low-resistance semiconductor coated film 123 and semiconductor coated film 119 are patterned simultaneously along the upper-layer wiring line section 125a. At the same time, openings 154a,156a are formed which correspond to the aforementioned second contact holes 154,156 and penetrate the upper-layer wiring line section 125a, low-resistance semiconductor coated film 123 and semiconductor coated film 119.

Similarly, at the base section of the signal line pad 162 and slant wiring line section 160 also, the three-layer film 125 is patterned along the lower-layer wiring line section 111b forming the upper-layer wiring line section 125a as extended from signal line 110, while the low-resistance semiconductor coated film 123 and semiconductor coated film 119 are patterned simultaneously along the upper-layer wiring line section 125b. At the same time, openings 164a, 166a are formed which correspond to the aforementioned second contact holes 164,166 and penetrate the upper-layer wiring line section 125b, low-resistance semiconductor coated film 123 and semiconductor coated film 119.

While dry etching techniques are used here to pattern the three-layer film 125, low-resistance semiconductor coated film 123 and semiconductor coated film 119, wet etching techniques may alternatively be employed therefor.

(6) Sixth Process Step

After completion of the fifth step, the interlayer dielectric film 127 of silicon nitride is then deposited on resultant structure to a thickness of 200 nm.

Figure 12:
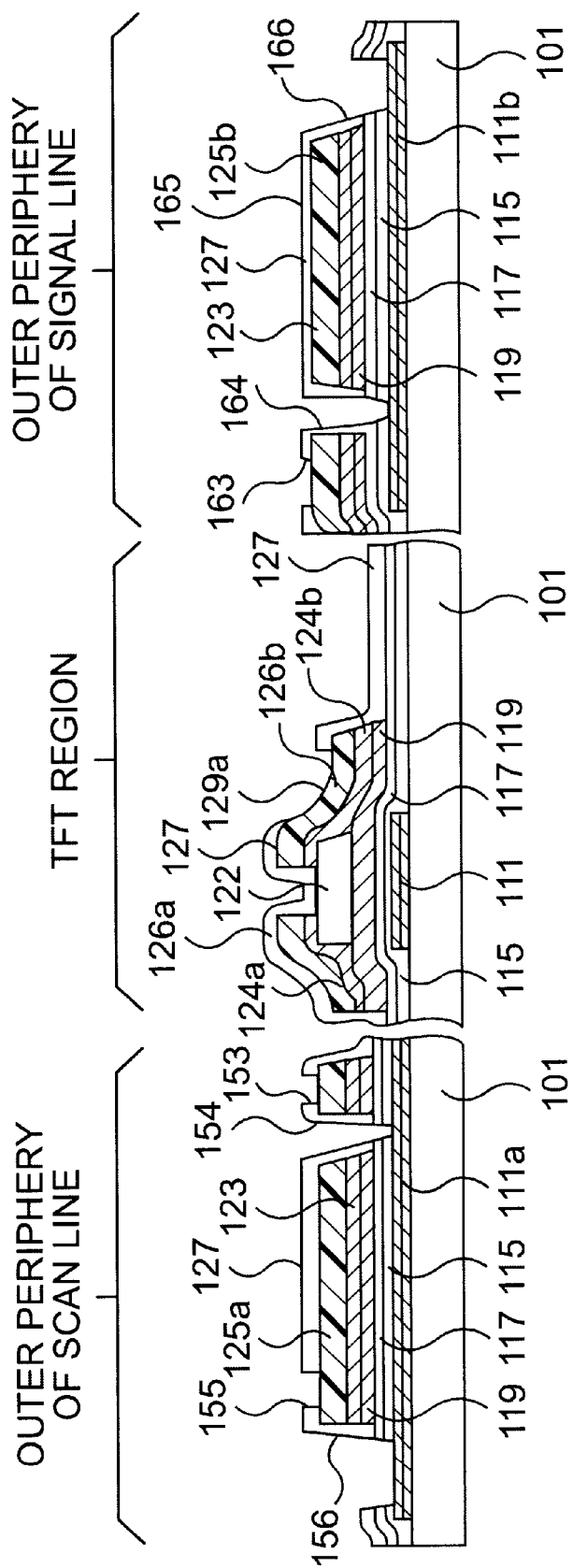
FIG. 12 is a diagram for explanation of a sixth step in the manufacture of the array substrate shown in FIG. 1.

Then, as shown in FIG. 12, exposure and development processes are effected using a fourth mask pattern; next, part of interlayer dielectric film 127 in a region corresponding to the source electrode 126b is removed away to form a contact hole 129a using dry etching techniques.

At the base section of scanning line pad 152 and slant wiring line section 150, both the interlayer dielectric film 127 and the first and second gate insulator films 115,117 corresponding to the openings 154a,156a are removed away at a time to form second contact holes 154,156 (the fourth patterning); simultaneously, the interlayer dielectric film 127 near the second contact holes 154,156 is removed to form first contact holes 153,155 each of which makes a pair with a corresponding one of the second contact holes 154,156.

Simultaneously, at the base section of signal line pad 162 and slant wiring line section 160, both the interlayer dielectric film 127 and the first and second gate insulator films 117 corresponding to the openings 164a,166a are removed away at a time forming second contact holes 164,166 (the fourth patterning); at the same time, the interlayer dielectric film 127 near the second contact holes 164,166 is removed away forming first contact holes 163,165 which constitute pairs with the second contact holes 164,166, respectively.

(7) Seventh Process Step

Figure 13:
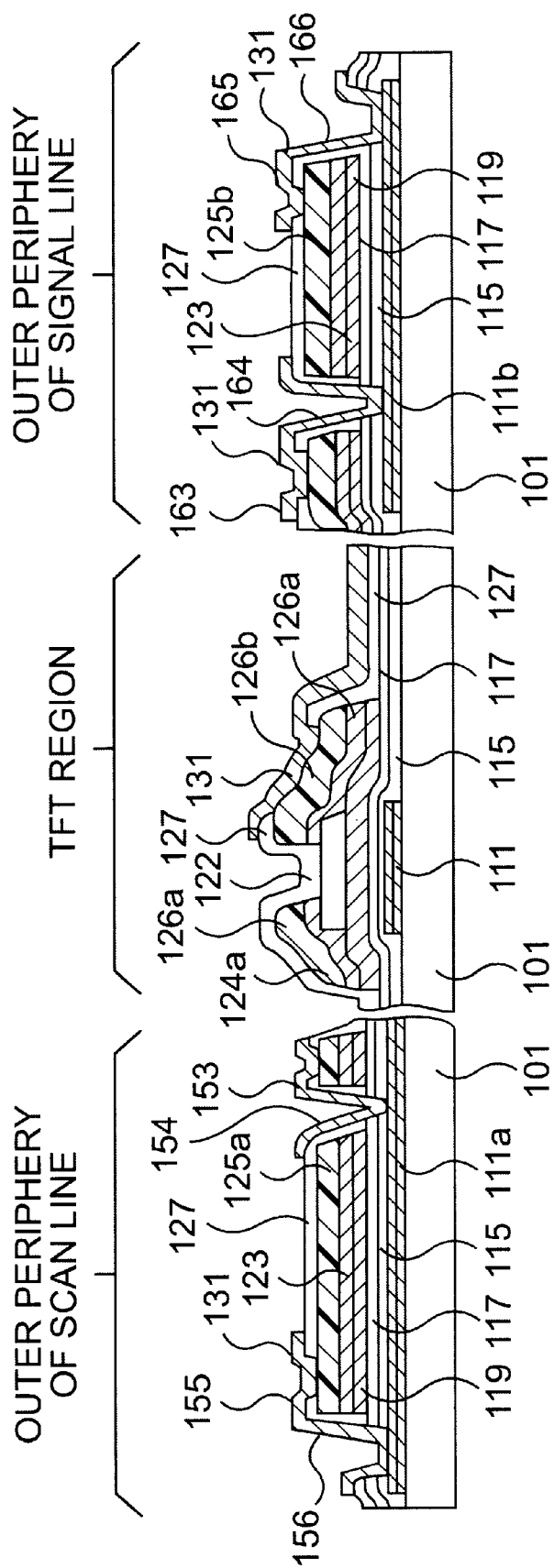
FIG. 13 is a diagram for explanation of a seventh step in the manufacture of the array substrate shown in FIG. 1.

After completion of the sixth step, as shown in FIG. 13, an ITO film is deposited by sputtering techniques to a thickness of 100 nm. The resulting structure is then subject to patterning treatment by exposure, development and dry etching techniques using a fifth mask pattern (the fifth patterning), thereby forming pixel electrodes 131.

The sputtering for ITO film was carried out at following conditions so as to deposit an amorphous ITO film. A target made by Mitsui Mining and Smelt Co. was used; charging electric power on Sputtering was set at 3.5 kW; pressure at film-forming process was set at 0.7 Pa; flow rate of $H_2O$ was set at 0.5 sccm. Thus formed ITO film had a sheet resistivity of 400 $\Omega/\square$.

This amorphous ITO film was then subjected to the patterning treatment by use of etching techniques, and subsequently subjected to heat treatment for converting the film to a crystalline ITO film having a low resistivity. When a completed array substrate was subjected to heat treatment at 250° C. for 30 min., the resulted ITO film have a sheet resistivity of 50 $\Omega/\square$, which is sufficiently low enough.

The patterning treatment is facilitated by conducting the patterning treatment at the state of amorphous ITO film as above.

On the other hand, while pixel electrodes are explained to be formed of ITO film in this embodiment, an IZO (Indium-Zinc-Oxide) film may be adopted in a totally same manner. In the case of adopting the IZO film, patterning treatment is easily achieved in the same manner with the amorphous ITO film, while its resistivity is sufficiently low enough even without heat treatment.

On wet-etching of the ITO film, HBr aqueous solution is used. In this occasion, no damage by the etching is observed on the Al alloy film. As for the other etching liquids, $HBr+FeCl_3$, HI aqueous solution, HCl aqueous solution or oxalic acid aqueous solution may also be used.

At the base section of the scanning line pad 152 and slant wiring line section 150, a signal line connection layer 131 is formed electrically connecting the first contact holes 153, 155 to second contact holes 154,156. This results in that the scanning line 111 and scanning line pad 152 are electrically coupled together by the double-layered slant wiring line section 150 consisting of the lower-layer wiring line section 111a and upper-layer wiring line section 125a.

In the base section of the signal line pad 162 and slant wiring line section 160 also, a signal line connection layer 131 is formed electrically connecting the first contact holes 163,165 to second contact holes 164,166. This results in that the signal line 110 and signal line pad 162 are electrically coupled to each other by the double-layered slant wiring line section 160 consisting of the lower-layer wiring line section 111b and upper-layer wiring line section 125b.

(Advantage of the Embodiment)

With the array substrate in accordance with the foregoing illustrative embodiment, the array substrate can be formed or manufactured by use of basically five masks. More specifically, the productivity can be improved with a decreased number of masks used while avoiding a decrease in the manufacturing yield thereof, as a result of locating the pixel electrodes at the uppermost position, and of employing a specific manufacturing method allowing several process steps to be done simultaneously which steps include: patterning the semiconductor coated films as well as the signal lines, source and drain electrodes at a time with the same mask pattern used therefor; forming the contact holes for interconnection of each source electrode and its associated pixel electrode; and forming the contact holes for exposure of contact nodes of signal lines and scanning lines.

Further, each slant wiring line section of signal lines and scanning lines has a double-layered structure consisting of the upper-layer wiring line section constituting an individual signal line and the lower-layer wiring line section constituting a corresponding scanning line permitting electrical connection between the base section of each slant wiring line section and a corresponding pad associated therewith. With such a structure, even if either one of such lower-layer wiring line section and upper-layer wiring line section is cut off or broken to be open-circuited accidentally, the other of them still continues to be connected eliminating occurrence of unwanted disconnection or failure of electrical interconnection as a whole.

Furthermore, a sufficient reduction in resistance can be achieved due to the fact that the slant wiring line section includes a specific wiring line layer that is comprised of a low-resistance material using at least Al as its major component.

Still further, since the signal line pads and scanning line pads for use in connecting bumps of external driver ICs and/or terminals of TCPs are substantially the same in structure, it becomes possible to allow the both to be connected under the same condition.

On the other hand, resistance of a scanning line is about 4.1 k$\Omega$ when 10 $\mu$m of average wiring width and 30.5 cm of wiring length are adopted for the device of 15-inch diagonal-size XGA. Reduction of the resistance is known to be achieved when compared with the resistance of about 5.6 k$\Omega$ for a scanning line having an anodic oxidized Al layer of 200 nm thick and a remaining Al layer of 200 nm thick (initial thickness of the layer before anodic oxidation is 300 nm). Moreover, the embodiment enables omission of anodic oxidation process including mask forming process for the anodic oxidation, thereby making a contribution to improving the productivity.

Further, because the scanning line 111 has a double-layer structure consisting of Al—Nd alloy film 1110 and Mo film 1111, forming of the hillock at heat treatment is sufficiently suppressed. Moreover, because of this double-layer structure, good cross-sectional shape tapered toward its upper surface (normal taper) is achieved due to etching-rate difference.

(Modification)

A description will now be given of a manufacturing method of an LCD device in accordance with one modification of the embodiment.

In the modification, the etching of the ITO film at the seventh process step is carried out in a cathode-coupling type etching apparatus by a dry-etching technique using HI+Ar(argon) gas system, instead of the above-mentioned wet-etching technique. Except this point, the manufacturing method of the modification is in a totally same manner with that of the above-mentioned embodiment.

Advantageous effect obtained by this modification is in a same manner with that of the embodiment.

Even in the occasions where dry-etching techniques are carried out at the process step for forming pixel electrode 131, the aluminum alloy 1110 that forms the scanning line 111 undergoes no etching damage from the etching gas, because of the presence of Mo film 1111, the first gate insulator film 115 and other films between the scanning line 111 and the etching gas.

When adopting dry-etching techniques for carrying out the patterning process, it is necessary to take into account managing or control of abnormal electric discharge, as well as prevention of resist deterioration or the like. However, in this case, the etching gas causes no corrosion on "a foundation or a first coat" (aluminum alloy 1110 and the like) through a pin-hole in insulator films, in contrast with the case of the above-mentioned wet-etching technique. Moreover, by dry-etching techniques, no problem arises on disposal of chemical liquid.

What is claimed is:

1. A method of manufacturing an array substrate for a display device having a scanning line and gate electrode on a substrate; a thin film transistor having a gate insulator film on said scanning line and gate electrode, a semiconductor film thereon, source and drain electrodes electrically connected to said semiconductor film; a signal line as taken out of the drain electrode to extend substantially perpendicularly to said scanning line; and a pixel electrode electrically connected to the source electrode, comprising steps of:

forming said scanning line and gate electrode by patterning a multi-layer metal film having an aluminum alloy layer and a refractory metal layer disposed on the aluminum alloy layer;

depositing said gate insulator film in direct contact with said scanning line and gate electrode at a temperature not less than 300° C.;

depositing an amorphous transparent electric conductive film;

patterning said amorphous transparent electric conductive film for forming said pixel electrode with a wet etching technique; and converting said amorphous film to a crystalline transparent electric conductive film having a low resistivity.

2. A method of manufacturing an array substrate for a display device according to claim 1 wherein said aluminum alloy contains at least one additive element selected from a group consisting of neodymium (Nd), yttrium (Y), scandium (Sc), samarium (Sm) and gadolinium (Gd), so that the sum of content of each of these additive elements in said aluminum alloy ranges from 0.5 through 10 atomic %.

3. A method of manufacturing an array substrate for a display device according to claim 1, wherein said high-melting point metal is any one metal selected from a group consisting of molybdenum (Mo), tungsten (W), titanium (Ti), tantalum (Ta), chromium (Cr), zirconium (ZR) and hafnium (Hf), vanadium (V) and niobium (Nb), or any one alloy comprised of two or more metals selected from this group.

4. A method of manufacturing an array substrate for a display device according to claim 1, wherein said refractory metal is at least one metal selected from a group consisting of molybdenum (Mo), tungsten (W), titanium (Ti) and tantalum (Ta), or an alloy comprised of two or more metals selected from this group.

5. A method of manufacturing an array substrate for a display device according to claim 1, wherein said gate insulator film comprises a silicone oxide film formed by an atmospheric-pressure CVD technique.

6. A method of manufacturing an array substrate for a display device according to claim 1, wherein said gate insulator film is a silicone oxide film or a silicone nitride film formed by a plasma CVD technique, or any multi-layer film comprised of these films.

7. A method of manufacturing an array substrate for a display device according to claim 1, further comprising steps of:
- depositing a semiconductor layer for said semiconductive film, and a second metal layer for said source and drain electrodes and signal lines, after forming of said scanning line and gate electrode and said gate insulator film;
- patterning said semiconductor layer and said second metal layer by using a same mask pattern, so as to form said thin film transistor and said signal line; and
- forming said pixel electrode disposed upper than said second metal layer.

8. A method of manufacturing an array substrate for a display device according to claim 7, comprising a patterning step of
- removing a part of said gate insulator film so as to expose an upper surface of an extended portion extended from said scanning line for forming a contact hole at periphery of the array substrate,
- before the step of forming said pixel electrode, and after the step of forming said thin film transistor and said signal line.

9. A method of manufacturing an array substrate for a display device according to claim 8, comprising steps of:
- forming an interlayer dielectric film after the step of forming said thin film transistor and said scanning line; and
- patterning said interlayer dielectric film, at the same time with and on the basis of same mask pattern with the step of removing said gate insulator film, so as to form a contact hole for exposing an upper surface of said source electrode, and so as to form a contact hole for exposing a part of an upper surface of an extended portion extended from said signal line at said periphery of the array substrate.

10. A method of manufacturing an array substrate for a display device according to claim 7, wherein, through an electric-conductive body that is formed simultaneously with said pixel electrode, said extended portion of the scanning line is in contact with said extended portion of the signal line.

11. A method of manufacturing an array substrate for a display device according to claim 7, wherein said refractory metal is deposited on said aluminum alloy layer to form said multi-layer metal film.

12. A method of manufacturing an array substrate for a display device according to claim 1, wherein said transparent, electric-conductive film is a film of amorphous ITO (Indium-Tin-Oxide) or a film of IZO (Indium-Zinc-Oxide).

13. A method of manufacturing an array substrate for a display device according to claim 1, in said wet etching technique, at least one selected from a group of hydrobromic acid (HBr•aq), hydroiodic acid (HI•aq) and oxalic acid ($(COOH)_2$) is used.

* * * * *

UNITED STATES PATENT AND TRADEMARK OFFICE
CERTIFICATE OF CORRECTION

PATENT NO. : 6,528,357 B2  Page 1 of 1
DATED : March 4, 2003
INVENTOR(S) : Dojo et al.

It is certified that error appears in the above-identified patent and that said Letters Patent is hereby corrected as shown below:

Drawings,
Replace old Figure 3 with the new Figure 3 drawing which is illustrated here.

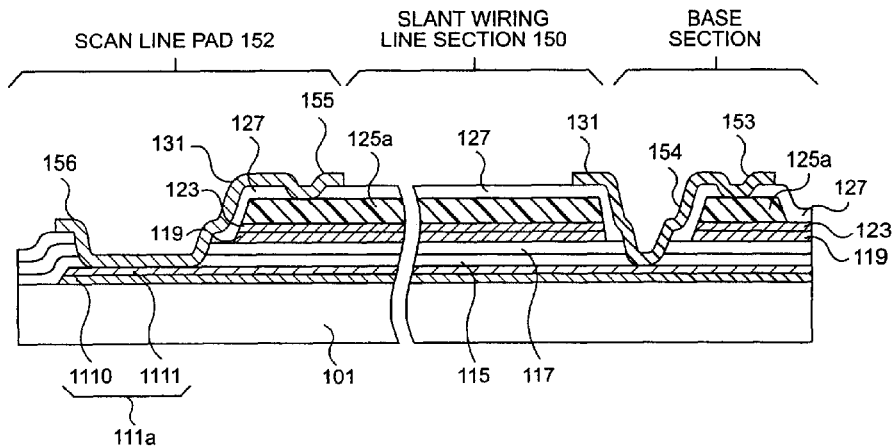

FIG. 3

Signed and Sealed this

Sixteenth Day of September, 2003

JAMES E. ROGAN
*Director of the United States Patent and Trademark Office*